United States Patent [19]

Ladwig

[11] Patent Number: 5,184,062
[45] Date of Patent: Feb. 2, 1993

[54] DYNAMICALLY CALIBRATED TRIGGER FOR OSCILLOSCOPES

[75] Inventor: Gregory J. Ladwig, Madison, Wis.
[73] Assignee: Nicolet Instrument Corporation, Madison, Wis.
[21] Appl. No.: 522,181
[22] Filed: May 11, 1990
[51] Int. Cl.⁵ .................... G01R 13/28; G01R 35/00
[52] U.S. Cl. .................... 324/74; 324/121 R; 364/487; 364/571.01
[58] Field of Search ............... 324/121 R, 74, 77 A, 324/130; 364/487, 571.01; 340/722; 307/491; 341/139, 158; 315/392

[56] References Cited

U.S. PATENT DOCUMENTS

| | | | |
|---|---|---|---|
| 3,656,053 | 4/1972 | Richman | 324/121 R |
| 3,696,399 | 10/1972 | Klein et al. | 341/139 |
| 4,121,164 | 10/1978 | Feucht | 328/181 |
| 4,283,713 | 8/1981 | Phillip | 391/142 |
| 4,364,027 | 12/1982 | Murroka | 321/130 |
| 4,553,091 | 11/1985 | Bristol | 324/74 |
| 4,581,585 | 4/1986 | Bristol | 307/491 |
| 4,642,519 | 2/1987 | Nakatsugawa et al. | 324/121 R |
| 4,743,844 | 5/1988 | Odenheimer et al. | 324/77 A |
| 4,755,951 | 7/1988 | Hollister | 364/487 |
| 4,823,076 | 4/1989 | Haines et al. | 324/121 R |
| 4,823,077 | 4/1989 | Landgraf et al. | 324/121 R |
| 4,868,465 | 9/1989 | Stevens et al. | 324/121 R |
| 4,958,139 | 9/1990 | Hyatt | 341/139 |

Primary Examiner—Vinh Nguyen
Attorney, Agent, or Firm—Foley & Lardner

[57] ABSTRACT

An oscilloscope provides adjustable control of the reference voltage level to the trigger comparator to calibrate the trigger for both gain and offset. An internal computer in the oscilloscope provides a digital input value to a gain digital-to-analog converter (DAC) the analog output of which is provided to the reference input of a level DAC. The level DAC also receives digital input from the control computer and provides its analog output to the reference input of the trigger channel comparator. The digital data value provided to the gain DAC determines the relative gain of the output signal from the level DAC. A calibration signal can be applied to the input of the trigger signal channel, preferably having a triangular waveform which varies between minimum and maximum values, allowing the computer controller to execute a calibration routine in which the voltages provided from the level DAC to the comparator are changed to find the digital data values corresponding to the minimum and maximum reference voltages at which the comparator stops changing states. This information can then be used by the computer controller to determine the relative gain of the trigger signal channel and to adjust the input to the gain DAC to provide a proper trigger reference voltage level. A further procedure is carried out to determine the offset which occurs in the trigger signal channel and to provide a correction count to the data value provided to the level DAC to properly accommodate the offset. Periodic recalibration in the field can be carried out utilizing an internal calibration signal generator which provides a calibration signal which can be correlated with the initial external calibration signal.

38 Claims, 9 Drawing Sheets

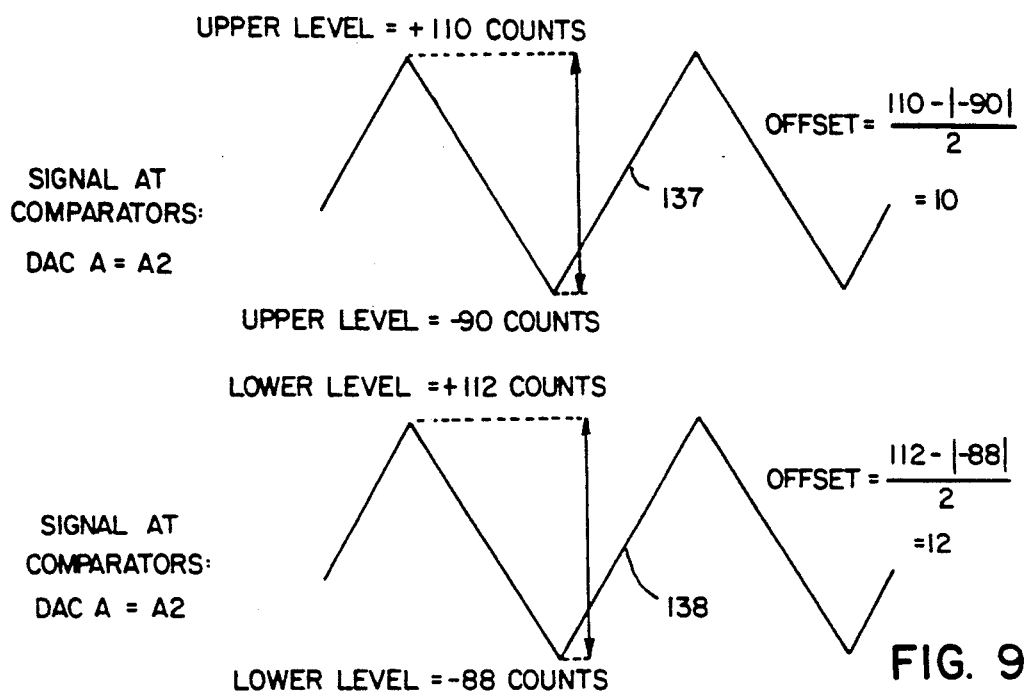
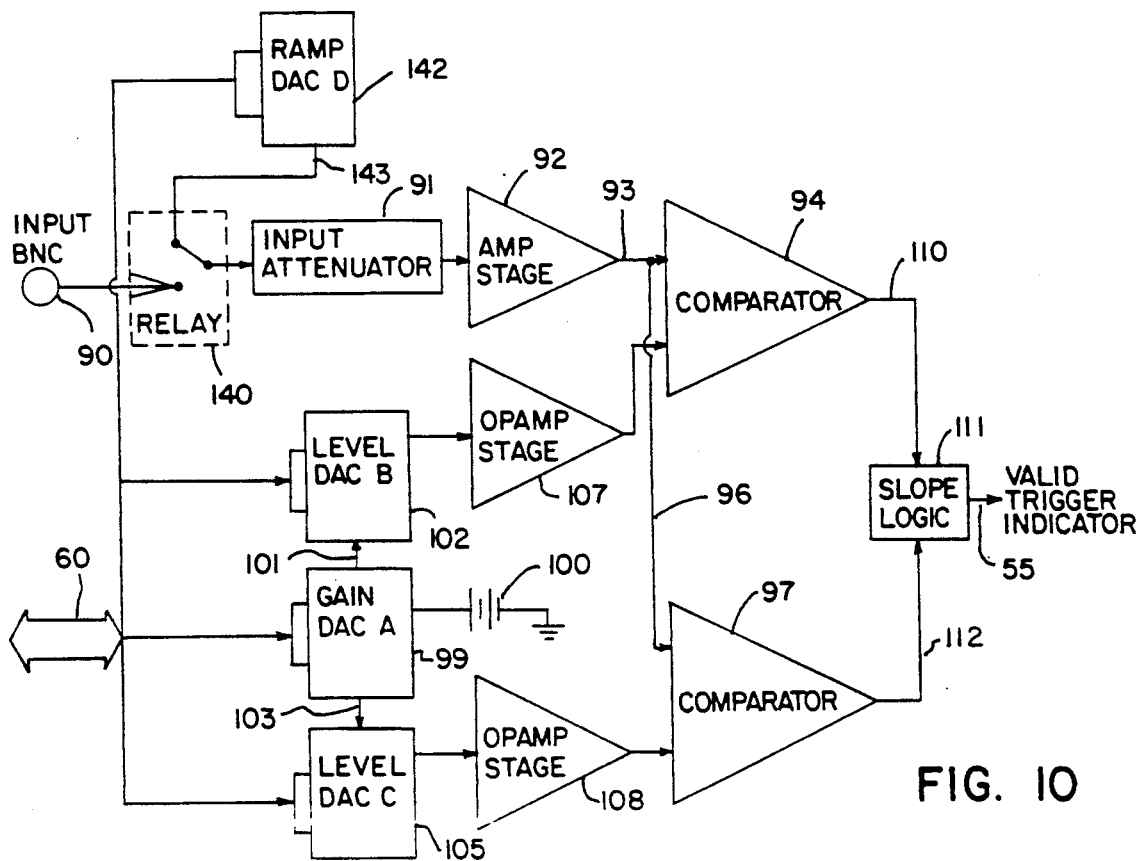
FIG. 9
FIG. 10

DYNAMICALLY CALIBRATED TRIGGER FOR OSCILLOSCOPES

FIELD OF THE INVENTION

The present invention is directed generally to the field of oscilloscopes and particularly to trigger circuitry for such oscilloscopes.

BACKGROUND OF THE INVENTION

Analog triggering circuitry is generally used in both analog and digital oscilloscopes. A conventional analog trigger circuit consists of signal conditioning networks, an analog comparator to compare the trigger signal to a predetermined trigger level, level controls, and slope validation circuitry. Such circuits must be designed carefully using analog design techniques that provide good gain and which minimize drift of performance characteristics over the operating temperature range and the aging cycle for the oscilloscope. Typically, potentiometers are provided to allow gain and offset adjustments during a calibration at the factory, which requires manual set-up and the use of test equipment. High cost components may be required to minimize the likelihood that the specified tolerances in operating characteristics will be exceeded during the life of the oscilloscope.

The exemplary trigger circuit of FIG. 1 illustrates some of the components involved in conventional triggering circuitry and the adjustments required. The trigger signal is received at an input BNC 21, which may be either an external trigger connector or may be connected to the input terminal for one of the channels to be displayed. The signal from the input is passed through an attenuator 22 and is then passed to an amplifier stage 24 which includes a gain adjustment potentiometer 25 and an offset adjustment potentiometer 26. At the factory, the potentiometers 25 and 26 are manually set by a technician to yield an output signal on the output line 28 of the amplifier 24 which has a desired gain level and response to a known input signal at the input 21 and which has a desired offset or null level. A signal on the line 28 is passed to a trigger comparator 30 which receives at its other input line 31 a voltage applied across a potentiometer 32. This potentiometer is set by the operator to yield the desired trigger level. The output of the comparator 30 is then passed to a slope logic circuit 34 which determines whether triggering is taking place on the proper slope of the signal, as selected by the operator, to validate when a proper triggering event has occurred. The output from the slope logic on a line 35 is a pulse which indicates the time of occurance of the valid trigger. This signal is then used by the oscilloscope to trigger a sweep across the face of the cathode ray tube (CRT) of the conventional oscilloscope or to initiate the acquisition and storage in a memory of digital data in a digital oscilloscope.

In addition to the necessary factory adjustments to properly calibrate the trigger circuit, recalibration may be necessary over a period of time as the equipment ages. For example, changes may occur in the characteristics of the attenuator 22, the amplifier 24, or the comparator 30 which may necessitate readjustment of the gain potentiometer 35 and the offset adjustment potentiometer 26. Such adjustment are generally made manually by a trained technician in the field, or by returning the oscilloscope to the manufacturer for factory calibration. The complexity of such calibration is compounded by the fact that the amplifier 24 is in the main signal path, which means that the amplifier must have proper gain adjustment over a relatively wide input range and over the wide range of frequencies which can be present in the input signal.

SUMMARY OF THE INVENTION

The oscilloscope apparatus of the present invention utilizes adjustable control of the reference voltage level provided to the trigger comparator to calibrate the trigger system both for gain and offset. No gain or offset adjustment potentiometers are required in the main signal channel which leads to the comparator, thus simplifying the circuitry for this channel. To accommodate changes in the gain and/or offset present in the signal channel, the voltage reference level provided to the comparator is selected under internal computer control to a proper level which will yield a comparator output signal at the correct absolute voltage levels which are provided to the input of the trigger channel.

The reference input voltage provided to the comparator is generated from a digital-to-analog converter (DAC) under control of a computer controller. Preferably, two DACs are used, one which operates from a fixed DC reference and a second which receives the output of the first DAC as its reference such that the second DAC operates in a multiplying mode. The computer controller determines the correct digital input value to the first DAC so that the second DAC has sufficient range to vary over the full scale of the signal amplitude to be encountered on the trigger signal channel. The value for the first DAC so selected remains constant while subsequently the computer controller provides digital input data to the second DAC to change its output voltage levels to the desired trigger reference level to be provided for the comparator. When the user changes trigger levels, either through the front panel or by computer control, the digital input to the second DAC is incremented or decremented while the input to the first DAC remains fixed. In this manner, the requirement for manual gain and offset adjustment is removed, and the accuracy and temperature stability of the circuit is incorporated into the reference level circuit rather than in the circuitry in trigger signal path. Accuracy and stability of the offset level circuitry is inherently easier and less expensive to obtain since the level adjustment circuitry does not need to operate over the frequency bandwidth required for the circuitry operating on the trigger signal.

To obtain trigger sensitivity and determine when a valid trigger occurs, a second or low level comparator is utilized which operates in parallel with the first or high level comparator. A separately addressable third DAC controls the level to the second comparator, while it receives its reference voltage from the first DAC and thus is adjusted to compensate for gain and offset in the same manner as the DAC which provides the reference level to the first comparator. One of the comparators provides a lower level reference while the other comparator provides a higher level reference. When trigger sensitivity is selected, trigger signals must pass through both levels to qualify as a valid trigger.

The oscilloscope system may be calibrated at the factory by providing an externally generated signal to the external input BNC. This signal is selected to be equal to the full scale trigger range and is at a known voltage level. An iterative procedure is then followed to adjust the value of the reference DAC to match the effective gain level through the trigger signal path. The offset introduced in the trigger signal path is also determined and an appropriate offset number calculated which is utilized as an offset value which is added to or subtracted from the digital input word provided to the second DAC for each comparator so as to cancel the effect of any offsets which have been found in the trigger signal path circuitry.

To perform field calibration, an additional ramp-DAC is provided which is connected to supply its analog output signal to the input attenuator of the trigger signal channel. This ramp-DAC is controlled by the computer controller to provide a signal to the trigger signal path which is a periodic signal ramping up and down at a controlled rate. The output signal provided by the ramp-DAC is effectively compared with the originally supplied test signal utilized during factory calibration and the procedure followed during factory calibration is again performed, utilizing the ramp-DAC as the input signal, to adjust for any changes in gain or offset that have occurred in the trigger circuitry since the time of factory calibration.

Further objects, features, and advantages of the invention will be apparent from the following detailed description when taken in conjunction with the accompanying drawings.

BRIEF DESCRIPTION OF THE DRAWINGS

In the drawings:

FIG. 10 is a block diagram of a further trigger circuit in accordance with the present invention which utilizes a ramp-DAC to provide an internal reference signal which allows self calibration of the system.

DETAILED DESCRIPTION OF THE INVENTION

Figure 1:
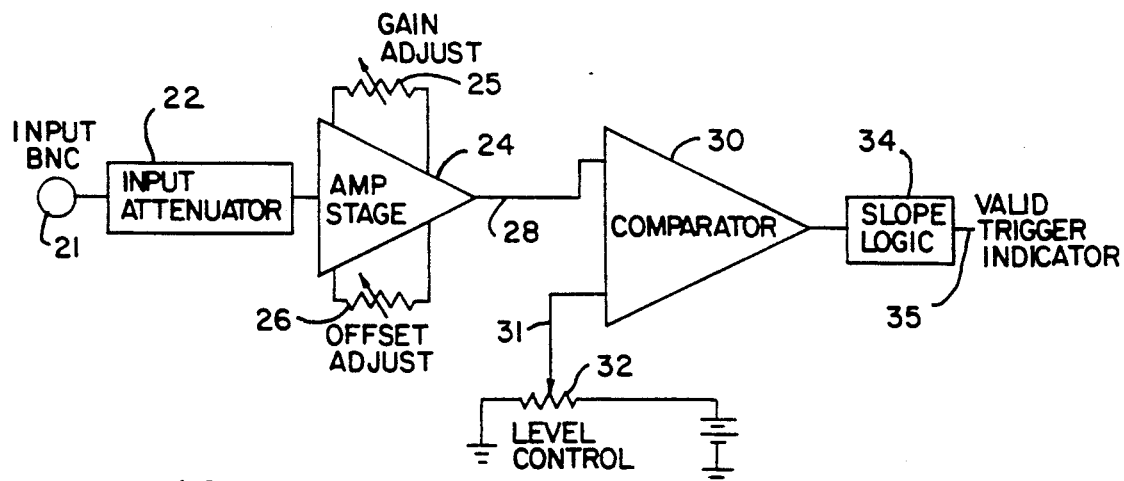
FIG. 1 is a schematic block diagram of an analog trigger circuit in accordance with the prior art.
Figure 2:
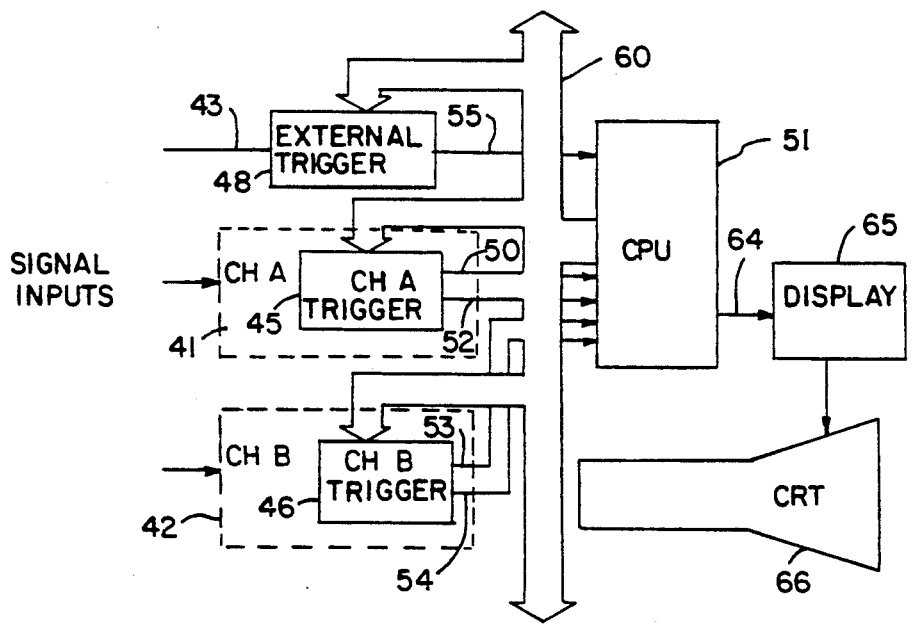
FIG. 2 is a block diagram of the basic components of a digital oscilloscope system in accordance with the present invention which operates under the control of a computer controller.

With reference to the drawings, a simplified block diagram of the essential components of the present invention as embodied in a digital oscilloscope is shown in FIG. 2. Although the invention as described herein is referred to in the context of a digital oscilloscope, the trigger circuit is not so limited and may be utilized in analog oscilloscopes which are controlled by a computer or equivalent controller. The oscilloscope apparatus includes a first signal channel 41 and a second signal channel 42, both of which may utilize conventional signal conditioning and gain adjustment circuitry, and in a digital oscilloscope may utilize digital triggering as disclosed in U.S. patent application Ser. No. 07/267,991 by McGibbon entitled "Digital Comparator Trigger Signal," now U.S. Pat. No. 4,958,139. A third external trigger channel 43 is provided to allow a separate signal to generate the trigger, if desired by the operator. The signal channel 41 (commonly referred to as channel A) has a trigger circuit 45 which operates on the channel A signal, and the signal channel 42 (commonly referred to as channel B) has a channel B trigger circuit 46 which operates on the channel B signal. The signal on the external trigger channel 43 is provided to an external trigger circuit 48 which operates on that signal. The output of the first signal channel 41 is digitized and provided on data lines 50 to a central processing unit (CPU) computer controller 51 (e.g., a Motorola 68010 microprocessor with associated ROM and RAM memory) and the trigger signal from the channel A trigger 45 is provided on a line 52 to the CPU 51. Similarly, the digitized signal data from the channel B signal is provided on data lines 53 to the CPU and the trigger signal from the channel B trigger 46 is provided on a line 54 to the CPU 51. The output signal from the external trigger 48 is provided on a line 55 to the CPU. For reason explained further below, the CPU provides digital control data on a data bus 60 to the external trigger 48, the channel A trigger 45, and the channel B trigger 46. The digital output data from the CPU 51 is provided on data lines 64 to a display driver unit 65 which includes digital-to-analog converters and amplifiers constructed in a conventional fashion, and the analog output of the display unit 65 is provided to the cathode ray tube (CRT) 66 to generate the display visible to the operator. Except for the trigger circuits and the data bus connections to them, and the control of these elements provided by the CPU, the components of the system may be of conventional design. They are shown herein for purposes of illustrating typical applications for the present invention, and any appropriate components and interconnections may be utilized.

Figure 3:
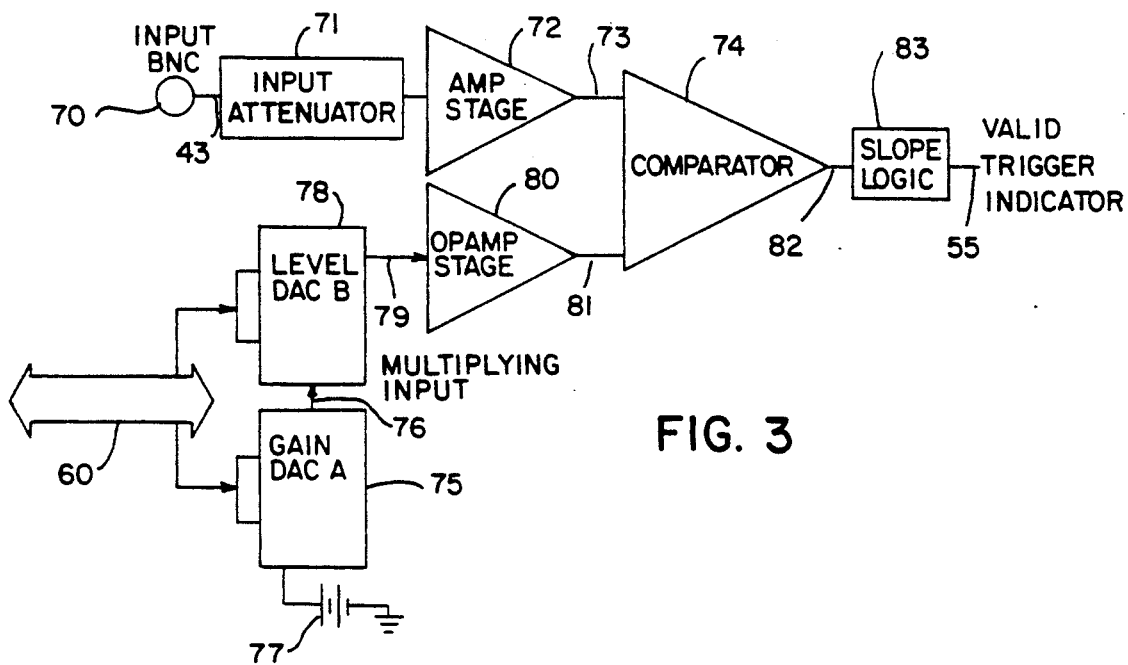
FIG. 3 is a block diagram of a trigger circuit in accordance with the present invention.

A block diagram of the external trigger circuit 48 is illustrated in FIG. 3, although it is understood that similar trigger circuits may be used for the channel A trigger 45 and the channel B trigger 46. The trigger circuit receives the external trigger signal at an input BNC 70 and passes the signal on the external trigger channel line 43 to an input attenuator 71. The attenuator 71 may be constructed in a conventional fashion as a fixed resistor divider to provide a desired gain signal in the trigger channel. The output of the attenuator 71 is passed to an amplifier stage 72 which has a fixed gain and does not have or require adjustment of either gain or offset. The output signal from the amplifier 72 on a line 73 is passed to one input of the comparator 74.

Digital data from the data bus 60 is provided to a first or gain digital-to-analog converter 75, also referred to herein as DAC A, which provides an output voltage on an output line 76 which is a function of the input data provided from the CPU on the bus 60 and a reference input voltage, which in the case of the DAC A is provided from a fixed voltage source 77, which may be an available system voltage level or one provided through a regulator circuit (e.g., LM 336AZ5.0, from National Semiconductor and others). Suitable DACs are AD7225 Quad DACs from Analog Devices and others. The output on the line 76 is provided to the reference voltage input of a second level DAC 78, also referred to herein as DAC B, which also receives data to its digital input from the CPU bus 60. The output voltage from the level DAC 78 is provided on an output line 79 to an operational amplifier 80 (e.g., LM 358 dual op amp from National Semiconductor and others). The output of the amplifier 80 on a line 81 is provided to the reference input of a comparator 74 (e.g., AD 96687 high speed comparator, Analog Devices and others). The output of the comparator on a line 82 is a high or low signal, depending on whether the voltage on the line 73 is greater than or less than the voltage on the reference line 81. The comparator output signal on the line 82 is provided to slope logic 83 which determines whether the trigger signal is changing in the proper direction, and the output of the slope logic 83 is the trigger signal on the line 55 which indicates whether a valid trigger is present.

Because the output voltage from the gain DAC A drives the reference of level DAC B, level DAC B may be said to be operating in a multiplying mode. The CPU controller 51 operating in accordance with its software performs a procedure to find the correct value for the input data word to DAC A so that DAC B has sufficient range for its output to vary over the full scale of the signal amplitude. The value found for DAC A is maintained constant despite subsequent changes in the digital input signal provided to DAC B. Whenever the user changes trigger levels, either through the front panel or under external computer control, the data word provided to DAC B is incremented or decremented by the CPU while the CPU leaves the data word to DAC A fixed.

Because the manual gain and adjustment circuitry is not present in the trigger apparatus of FIG. 3, its accuracy and temperature stability are dependent upon the reference level determination circuit, consisting of the DACs 75 and 78 and the operational amplifier 80, rather than on the signal path attenuator 71 and the amplifier 72. Accuracy and stability is thus inherently easier and less expensive to achieve since the components providing the reference level do not need to operate over the frequency bandwidths required for the signal path components 71 and 72.

Figure 4:
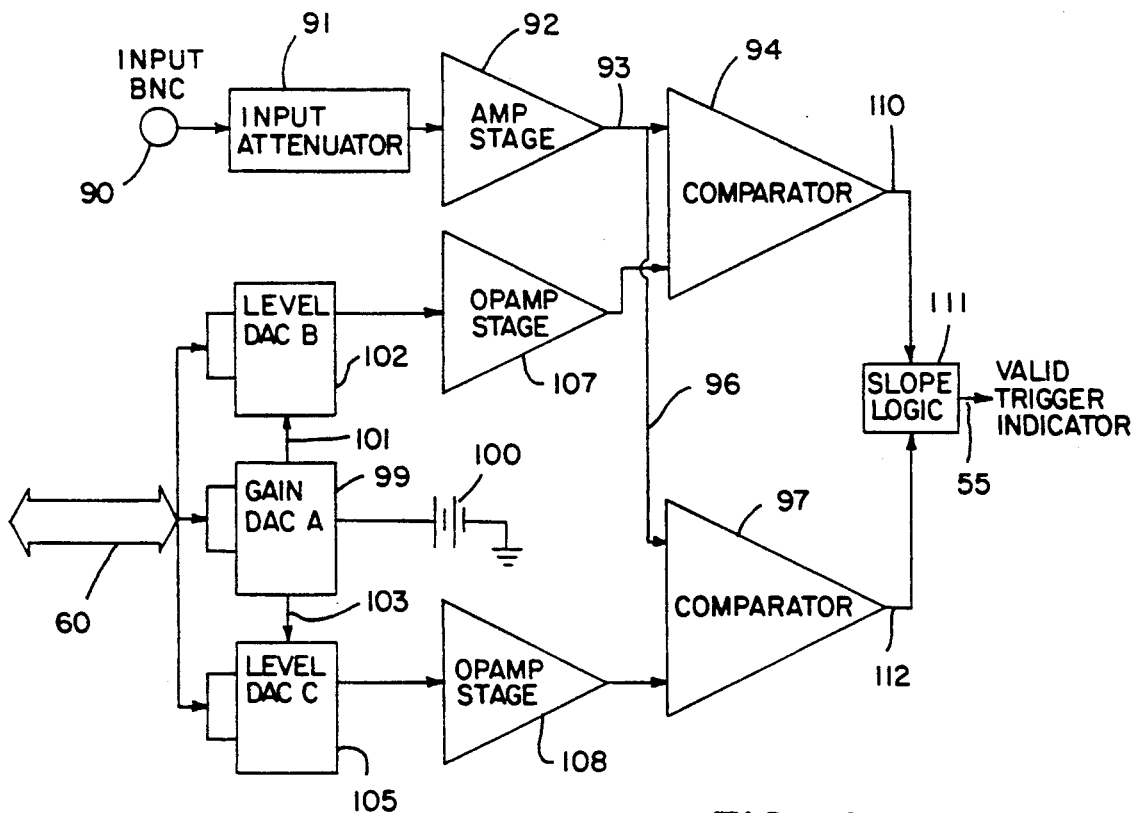
FIG. 4 is a block diagram of a further trigger circuit in accordance with the present invention which provides trigger sensitivity.

To obtain appropriate trigger sensitivity so that the trigger signal is provided only when a specified change in level occurs and on the proper slope, the modified trigger circuit of FIG. 4 may be utilized. In this circuit, the trigger signal is received at the BNC 90 and provided to an input attenuator 91, the output of which is provided to an amplifier 92, with the amplified signal from the amplifier on a line 93 provided to one input of a comparator 94. The signal from the line 93 is also provided on a line 96 to one input of a second comparator 97. For reference herein, the comparator 94 will be called the upper level comparator and the comparator 97 will be called the lower level comparator.

A data word from the CPU data bus 60 is provided to a gain DAC 99, also referred to herein as DAC A, which receives a constant reference voltage from a voltage source 100 (e.g., LM 366AZ5.0) to its reference input. The analog voltage output voltage from the gain DAC A, determined as a function of the digital data word on the bus 60 and the fixed reference voltage from the source 100, is provided on a line 102 to the reference voltage input of a level DAC 102, referred to as level DAC B, and on a line 103 to the reference input of another DAC 105, referred to as level DAC C. DACs 102 and 105 also receive their digital data inputs from the CPU data bus 60. The output voltage from the DAC 102 is provided through an operational amplifier 107 to the reference input of the comparator 94. The output voltage from the DAC 105 is provided to an operational amplifier 108, and the amplified output of the amplifier is provided to the reference input of the comparator 97. The output of the comparator 94 on a line 110 is provided to slope logic 111, and the output of the comparator 97 on a line 112 is also provided to the slope logic 111. The slope logic provides an output signal on a line 55 when a valid trigger has occured.

Because the output of the gain DAC 99 (DAC A) serves as the reference for the level DACs 102 and 105, the range of DACs 102 and 105 are the same for a given DAC A input data word provided from the CPU bus 60. The CPU provides data to the DACs 102 and 105 separately to provide a desired output level from each of these DACs, with the DAC 102 having the higher output voltage level and the DAC 105 having the lower output voltage level. A trigger signal on the line 93 must pass through both levels, and trigger both comparators 94 and 97, to qualify as a valid trigger.

The foregoing description of the calibration routine indicates the manner in which the DACs are controlled to determine the DAC input values to correct for gain and offset in the trigger channel. In terms of the voltages applied to the reference input of the comparators, the gain calibration can be carried out in accordance with the following steps: applying a calibration signal to the input of the trigger signal channel which varies linearly and periodically between known high and low voltage values which are equal to a nominal full scale trigger signal range, and which has zero offset; applying a selected voltage level to the reference input of the comparator, determining whether the comparator changes, state during the period of the trigger calibration signal and changing the voltage level provided to the reference input of the comparator until the voltage is at a level at which the comparator stops changing state at the maximum of the calibration signal during the period of the signal, and storing the voltage level value as the maximum voltage value; providing another selected voltage level to the comparator reference input and then changing the voltage level until the comparator just stops changing states at the minimum of the calibration signal during the period of the signal, and storing the voltage value as the minimum voltage value; comparing the difference between the maximum and minimum voltage values with the nominal full scale range of the input signal to determine a gain correction factor; and thereafter correcting the value of the trigger level voltage being applied to the reference input of the comparator by the gain correction factor when triggering on input signals provided to the trigger signal channel input during normal oscilloscope operation.

The correction of offset may be considered in terms of the voltages applied to the comparator in the following steps: applying a selected trigger level voltage corrected by the magnitude correction factor, to the reference input of the comparator while the calibration signal is being applied to the trigger signal channel input and then changing the gain corrected trigger level voltage applied to the reference input of the comparator until the comparator stops changing state at a top voltage above a nominal level of zero volts and then changing the gain corrected voltage applied to the reference input of the comparator until the comparator stops changing at a bottom voltage below a nominal level of zero volts; determining an offset correction factor as one-half the difference between the absolute values Of the top and bottom voltages; and adding the offset correction factor to nominal trigger level voltages applied to the reference input of the comparator when triggering on a trigger signal applied to the input of the trigger signal channel.

In describing the operation of the foregoing circuit, it is noted initially that gain and offset correction potentiometers are not needed in the signal path. In fact, it is not necessary that the trigger signal path have a specific accuracy level, other than that the variation between the trigger path circuitry from oscilloscope to oscilloscope be within some reasonable range. In the present invention, the performance characteristics and the calibration correction are obtained from the level derivation circuitry which determines the trigger level for the comparator. As noted, such a technique allows less complicated trigger signal path circuitry and enables the CPU to control calibration. The main function of the calibration procedure is to match the trigger level gain to the signal gain, rather than matching the signal gain to a specific trigger level as is conventionally done. Because the trigger levels are controllable by the CPU controller, the procedure for carrying out the calibration may be performed at convenient intervals, so that any drift in the characteristics of the trigger signal path components can be determined and corrected regularly, for example, at times when the user changes trigger levels.

For an exemplary description of the operation of the trigger level circuit under CPU control, it may be assumed that the CPU control levels will be divided into 200 discrete levels over the full scale range of the trigger signal. When the user changes the trigger level via the front panel knob from the top of the range to the bottom of the range, the CPU controller will provide data on the data bus 60 to decrement the level DAC, e.g., the DAC 78 of FIG. 3 or the DACs 102 and 105 of FIG. 4, by 200 least significant bit (LSB) counts. If eight bit DACs are used, this leaves 56 possible levels still available. The significance of these extra DAC counts is discussed further below.

Figure 5:
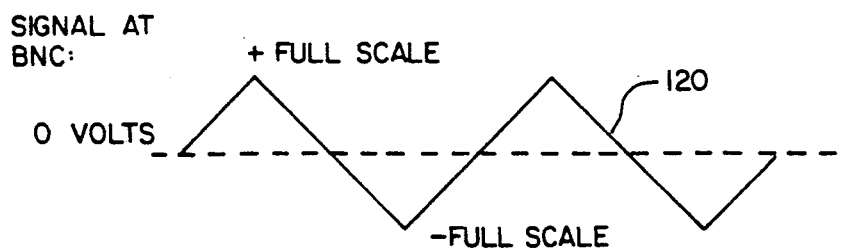
FIG. 5 are exemplary graphs illustrating the signal at the input to the trigger circuit and the signal at the comparators in the trigger circuit.
Figure 5:
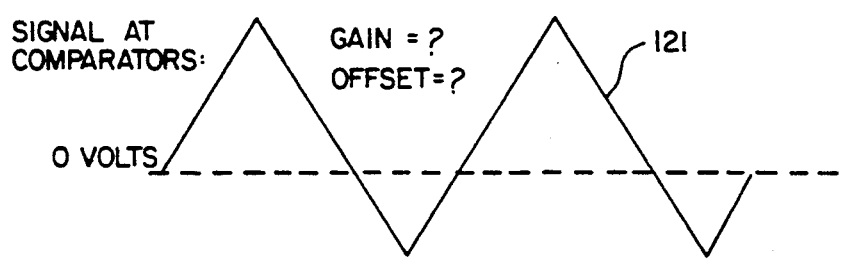

During factory calibration, a zero offset triangular wave signal is applied to the external input BNC. The amplitude of this signal is equal to the full scale trigger range. This signal goes through the various stages of the trigger signal path (i.e., the attenuator 71 and amplifier 72 or attenuator 91 and amplifier 92) and is eventually applied to the analog comparators (the comparator 74 of FIG. 3 or the comparators 94 and 97 of FIG. 4). Because of the characteristics of the circuit components, gain and offset errors are introduced into the signal by the time it reaches the input of the comparators. These errors are the cumulative result of the tolerances and initial offsets inherent in the components. FIG. 5 illustrates the effects of these tolerances and offsets. The graph 120 shows the triangular wave trigger signal at the BNC which has a specified peak-to-peak voltage value and zero offset. By the time the signal reaches the comparators, the signal as illustrated by the graph 121 has an effective DC level which is offset from zero voltage and generally has a peak-to-peak voltage value which is different than the peak-to-peak value of the triangular wave signal 120.

Figure 6:
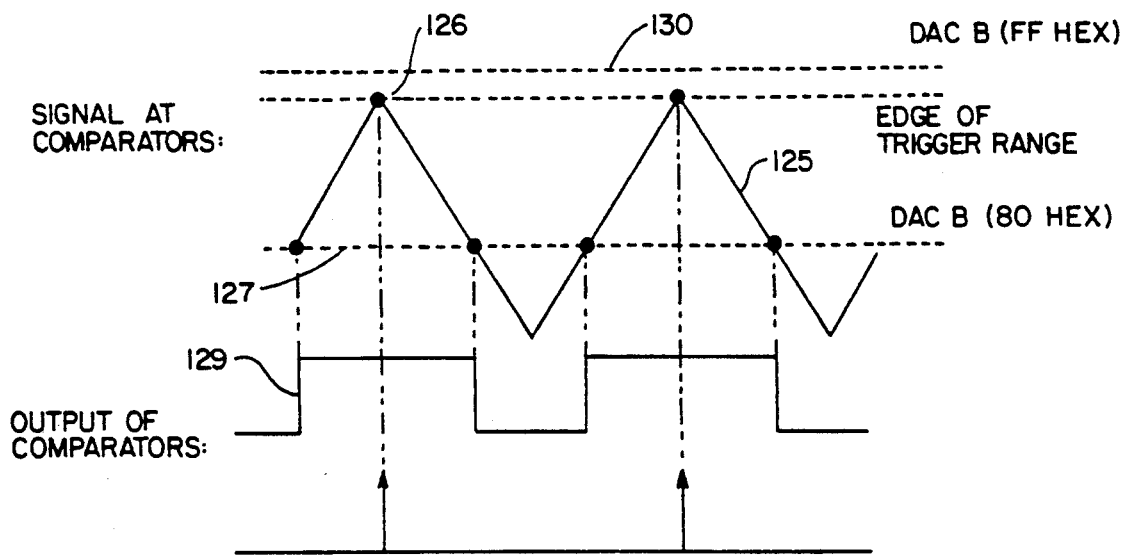
FIG. 6 are exemplary graphs illustrating the signal at the comparators in the trigger circuit and the output of the comparators during calibration.
Figure 7:
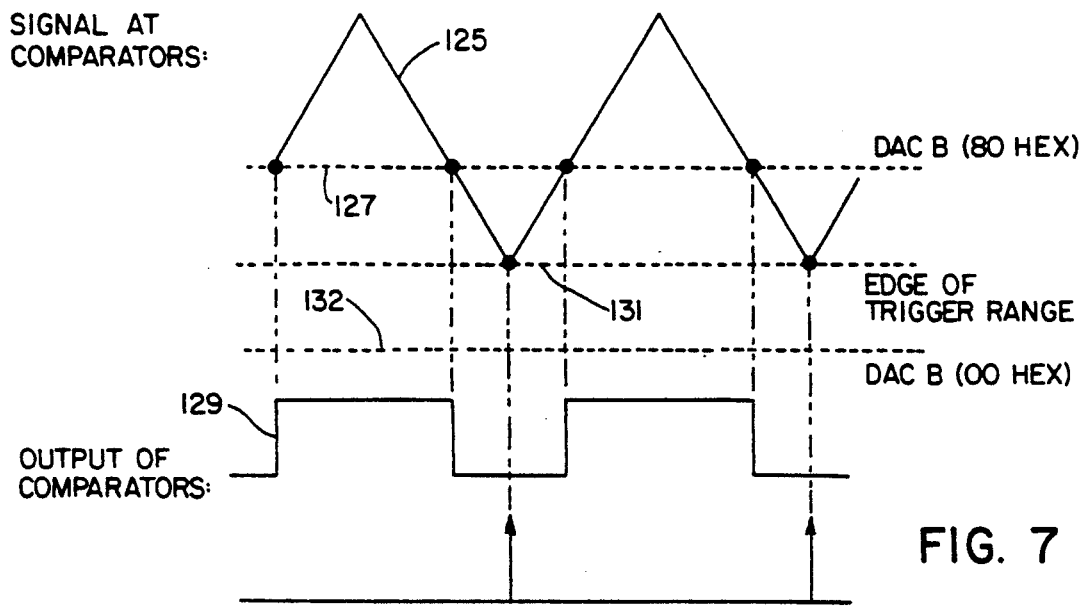
FIG. 7 are exemplary graphs illustrating the signal at the comparators and the output of the comparators at a further stage during calibration.
Figure 8:
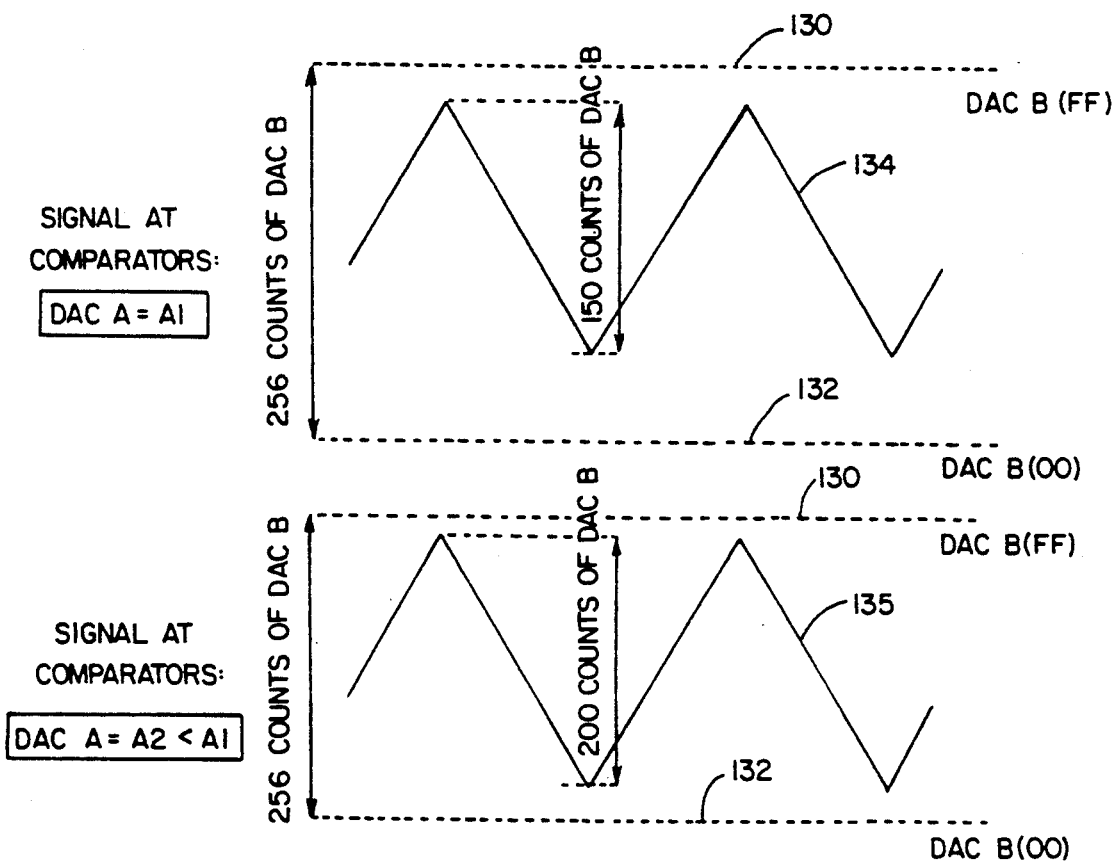
FIG. 8 are exemplary graphs illustrating the signal at the comparators during the calibration procedure FIG. 9 are exemplary graphs of the signal at the comparators at a later stage during the calibration process.

The first step of the calibration involves finding the value of the digital input signal to the reference DAC, the DAC A, that gives the desired 200 LSBs of level movement over the full scale trigger input signal. With reference to the waveform shown in FIG. 6, the procedure begins by providing DAC A, the reference DAC, an initial value of FF in hexadecimal (hex), the largest possible value. The present discussion will relate to the circuit of FIG. 4, although it is noted that the procedure is essentially similar for the circuit of FIG. 3. DAC B, the upper level DAC 102, then receives from the CPU on the data bus line 60 an initial input data word of 80 hex, which puts the output of the upper level DAC 102 at the center of its range. The input to the comparator 94 is shown by the graph 125, which reaches a maximum 126 at the edge of the trigger range and goes through the level at which the comparator will toggle at a voltage level 127 which is the voltage provided by DAC B with a digital input of 80 hex. The output of the comparator 94 is illustrated by the graph 129 in FIG. 6. As illustrated therein, at these levels, the output of the comparator is toggling to produce the rectangular wave signal 129 as shown in FIG. 6. The trigger logic 111 interprets this comparator output as a valid trigger and supplies the trigger information to the CPU. The CPU then carries out a binary search for the boundary value of DAC B that causes the valid trigger indicator to stop happening at the top edge 126 of the trigger waveform. This DAC value will be somewhere between 80 hex (the voltage level 127) and FF hex (the voltage level 130 in FIG. 6) and when found is stored temporarily in a register. The voltage where this happens is at the level 126 and the output of the comparator is a spike as illustratively shown at 128. The binary search method is used to reduce the number of iterations of the program loop that are necessary to converge on the final value. The next step carried out by the CPU controller is to find the input data word value to DAC B at which triggering stops on the bottom of the trigger triangular waveform. With reference to the illustrative graphs of FIG. 7, a binary search is carried out to find the value at which the bottom 131 of the triangular wave 125 is at the edge of the trigger range and triggering is thus at the bottom of the triangular waveform. These data value will be between 80 hex and 00 hex (the voltage level 132 in FIG. 7). This value is then subtracted from the value stored previously in the register, which represented the count to the top of the waveform, and the result will generally be some number of DAC LSBs which is less than 200. The fact that the resulting value is less than 200 LSBs means that the peak-to-peak voltage range of the level DAC B was set too high to begin with. The range of the level DAC B is determined by its reference input, which is supplied by DAC A. Thus, the next step carried out by the CPU controller is to decrease the value of DAC A by a selected amount. The method described just above to find the number of level LSB counts between the top and bottom of the waveform is then repeated for this new value of the input to DAC A. A new result is found and compared to the desired result of 200. The process of decrementing and incrementing the digital input data to DAC A and generating new results is repeated in a binary search until a result of 200 is achieved. In FIG. 8, the graph 134 indicates the signal at the comparators where in the input data to the DAC A is equal to some value A1 and illustratively shows a count of 150 from the peak-to-peak of the waveform 134. The waveform 135 in FIG. 8 is found at some input value of DAC A equal to A2 which is less than A1, resulting in a full 200 counts of DAC B to cover the peak-to-peak of the waveform 135. The value A2 provided to DAC A which is found to achieve the 200 counts is stored in a register.

It may be noted that at this point the level count from 80 hex to the top of the waveform and the level count from 80 hex to the bottom of the waveform is not necessarily equal. What is known is that the difference between the top and bottom of the waveform is 200 counts. In fact, the actual voltage levels are not important. Essentially, the number found in this manner for the input value to DAC A represents the required gain for the upper level DAC (DAC B) and its associated circuitry to match the gain of the full scale trigger signal input. As shown in FIG. 4, the lower level DAC 105 shares the same reference voltage as the upper level DAC 102 as provided by DAC A, and preferably the lower level circuitry is designed symmetrically to and matches the upper level circuitry. Therefore, at this input value to DAC A, the lower trigger level circuitry will also have 200 levels of movement over the full scale range of the trigger signal input.

The next step carried out by the CPU controller is a determination of what the DC offsets of the signal path are in relation to both the upper and lower level circuits. Using the same DAC A value determined in the manner described above, the value A2, the upper level count from 80 hex to the top of the waveform and the count from 80 hex to the bottom of the waveform are found using the same procedure as described above. The offset count in LSBs is the difference in the counts divided by two. This result is stored in a register. The offset can be anywhere within the allowable 56 LSBs which are left. The same procedure is applied to the lower level, with its result being stored in another register. Examples of calculations of offset for the upper level circuit with the signal 137 at the comparator 94 and for the lower level circuit with the signal 136 at the comparator 97 is shown in FIG. 9.

At this point, all of the information which is required to move the trigger reference levels provided to the comparators to their desired values are known. The value of 80 hex represents the ideal center of the waveform if there were no offsets. The proper value for the reference DAC that has been found in accordance to the Procedure above, the value A2, is provided on the data bus lines by the CPU to DAC A, and the offset values just found are added to the ideal 80 hex value. Using the example waveforms 137 and 138 shown in FIG. 9, if the user wishes the upper level to be at a positive 50 percent full scale of the trigger signal, then the level DAC 102 would be provided with input data having a value equal to (80 hex+50 levels=32 hex)+-(upper level offset=10 levels=A hex)=BC hex.

The foregoing procedure calibrates the trigger DACs to a precision external reference given the conditions of the analog circuitry at the time of calibration. This may be carried out as a one time factory calibration that requires the technician to connect a signal generator to the external trigger BNC and then execute the calibration routine which is contained in the CPU controller 51. However, the characteristics of the circuitry may change over time and thus it is desirable to be able to carry out calibrations in the field, preferably without the requirement for operator intervention. Internal calibration is carried out in accordance with the present invention in the apparatus of the invention utilizing an internal ramp generator so that subsequent calibration can take place without using the externally connected signal generator.

A block diagram of a trigger circuit in accordance with the invention which can carry out self calibration is shown in FIG. 10. The major components of this circuit are substantially identical to the circuit of FIG. 4 and similar parts are numbered similarly. In addition to those components, a relay 140 is provided between the input BNC 90 and the input attenuator 91. The relay is also connected to receive the output from a ramp-DAC 142 (also referred to as DAC D) on an output line 143. The relay can be switched to receive either the input from the BNC 90 or the voltage level on the output line 143. The ramp-DAC 142 is connected to the CPU bus 60 to receive digital input data from that bus. Because the output signal from the DAC 142 is switched into the signal path in front of the input attenuator 191, the signal provided from the DAC is subject to the same errors as the signal applied to the BNC 90. The ramp DAC 142 operating under the control of the CPU effectively acts as an internal signal generator.

Figure 11:
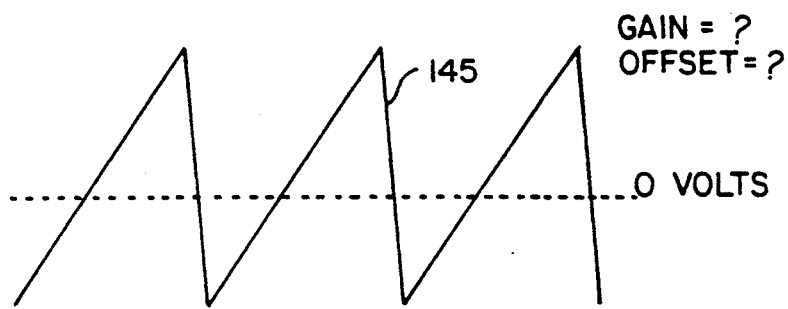
FIG. 11 is a exemplary graph illustrating the signal at the comparators utilizing the internally generated ramp signal in the system of FIG. 10.

FIG. 11 shows an illustrative signal 145 that will be seen at the comparators when the internal ramp signal generated from the DAC 142 is switched into the input by the relay 140. Again, it is not necessary to know the absolute voltage levels of this signal, as long is it is in some reasonable range. All that is required is that the temperature and the effect of aging on the signal generated from the ramp-DAC 142 are better than the desired accuracy of the final calibration. At this point, the CPU controller can carry out an internal calibration to determine both the offset and gain of the internal ramp signal.

Utilizing the method described above, the upper level count to the top and bottom of the ramp signal from the DAC 142 is found using the value of the reference DAC which was found for the external source, the value A2. This count will not be equal to 200 LSBs since the ramp amplitude is not equal to a full scale voltage swing. However, it is now known that the internal ramp is some percentage of the external full scale input, equal to the count just found divided by 200. This new count will serve as the count boundary when using the internal ramp, instead of a count boundary of 200. After it is found, this internal boundary value is stored in memory by the CPU, preferably in an EEPROM such as a 93C46 from National Semiconductor and others.

Once the new count boundary is known, the reference DAC value for DAC A required to get to this new internal boundary is found. The procedure is the same as described above when using the external signal source, with binary searches being used on the level and reference DACs to converge on the value of the reference DAC that gives the new boundary count. The ratio of the old reference DAC value over the new reference DAC value is found and is also stored by the CPU controller, again preferably in an EEPROM. This value represents a scale factor which will be used when converting the reference DAC from the use of the internal ramp back to the external BNC.

The final step in characterizing the internal ramp signal requires a determination of the offset of the internal ramp. The ramp signal from the ramp-DAC is switched-in, and using the same procedure described above for finding the offset using an external signal source, the offset for the ramp signal as generated plus that contributed by the signal path can be found. Subtracting out the already known offset for this signal path yields the offset of the ramp signal alone. The offsets from both the upper and lower levels are found and stored by the CPU controller, preferably in an EEPROM. At this point the internal ramp signal is now fully characterized. The relay is returned to the BNC position for receipt of normal triggers.

Preferably, re-calibration is performed on a periodic basis. For example, when the user selects external triggering as a source, the oscilloscope apparatus Preferably performs a quick auto-calibration on its external trigger. The internal ramp source is momentarily switched-in so that any changes that have occurred in the signal path can be measured. The input scale factor that was stored in the EEPROM during the initial (factory) calibration is recalled. This value multiplied by 200 is used to represent the count boundary. A new reference DAC value is determined using this count boundary. The method is the same as the initial factory calibration. In this manner the microprocessor code is not duplicated. The binary search converges on a reference DAC value that results in having upper level DAC counts equal to the count boundary. It is noted that the resulting reference DAC value may not be the same as in the initial (factory) calibration due to gain drift of the trigger signal path circuit parameters. But since the original count boundary is being used, it is known that the level DACs have the same number of counts over the same ramp output range as the original (factory) calibration.

With the relay still in ramp position, the upper level and lower level offsets are found using the reference DAC value just found above. The method is the same as the initial (factory) calibration. However, these counts include the offset contribution from the internal ramp. The values for the internal upper and lower offsets are recalled from the EEPROM and subtracted out of the counts just found. The remaining counts are the contribution of the analog signal path only. Note that the number of counts may not be the same as the original (factory) calibration due to offset drift in the trigger signal path.

Finally, the reference DAC scale factor is recalled from the EEPROM and applied to the current value of the reference DAC. The relay is then returned to the BNC position to receive external triggers. The offset values are added to the appropriate trigger level DAC by the controller.

Figure 12:
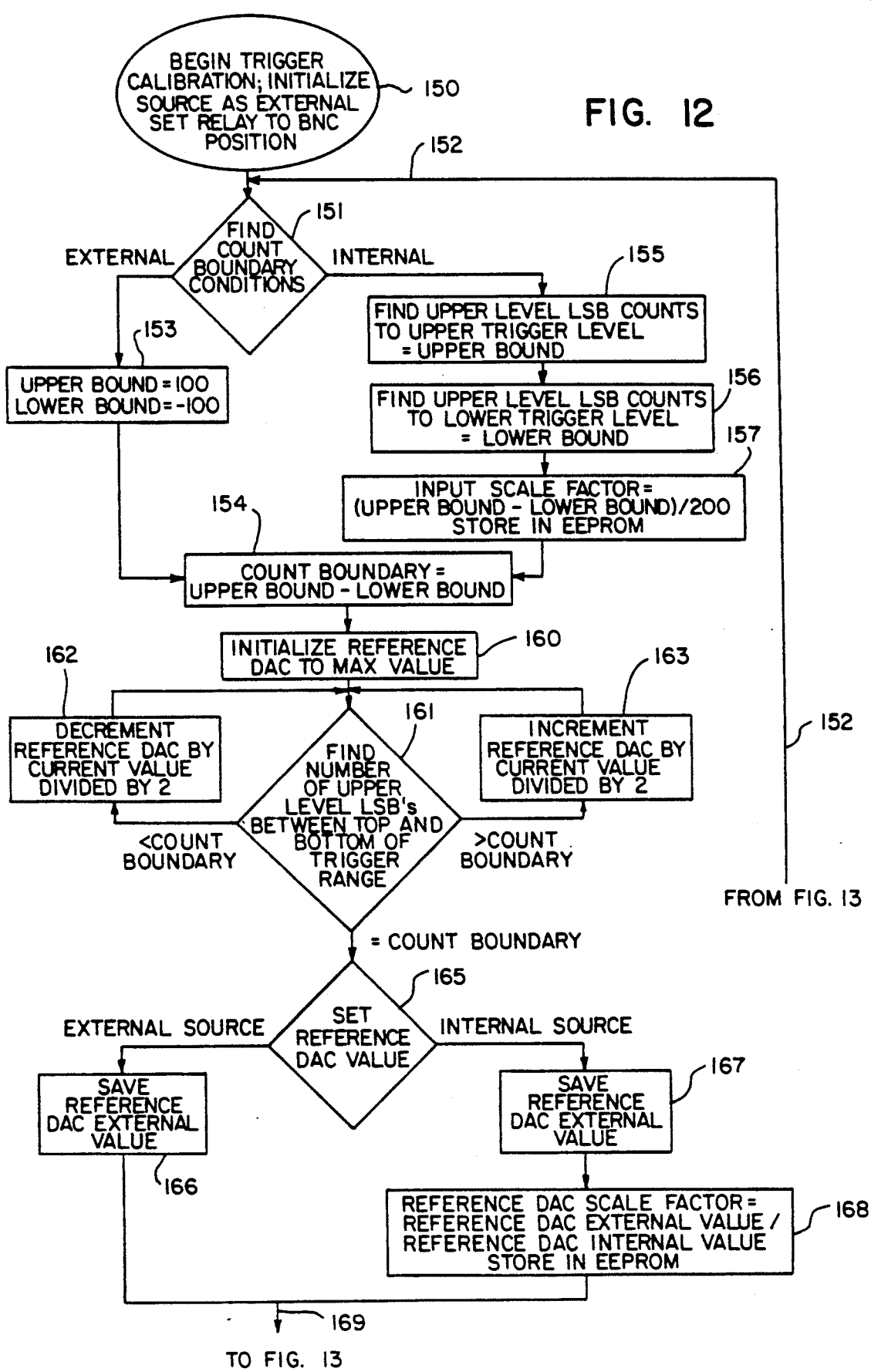
FIG. 12-14 are flow charts showing the CPU program steps for carrying out the calibration procedures.
Figure 13:
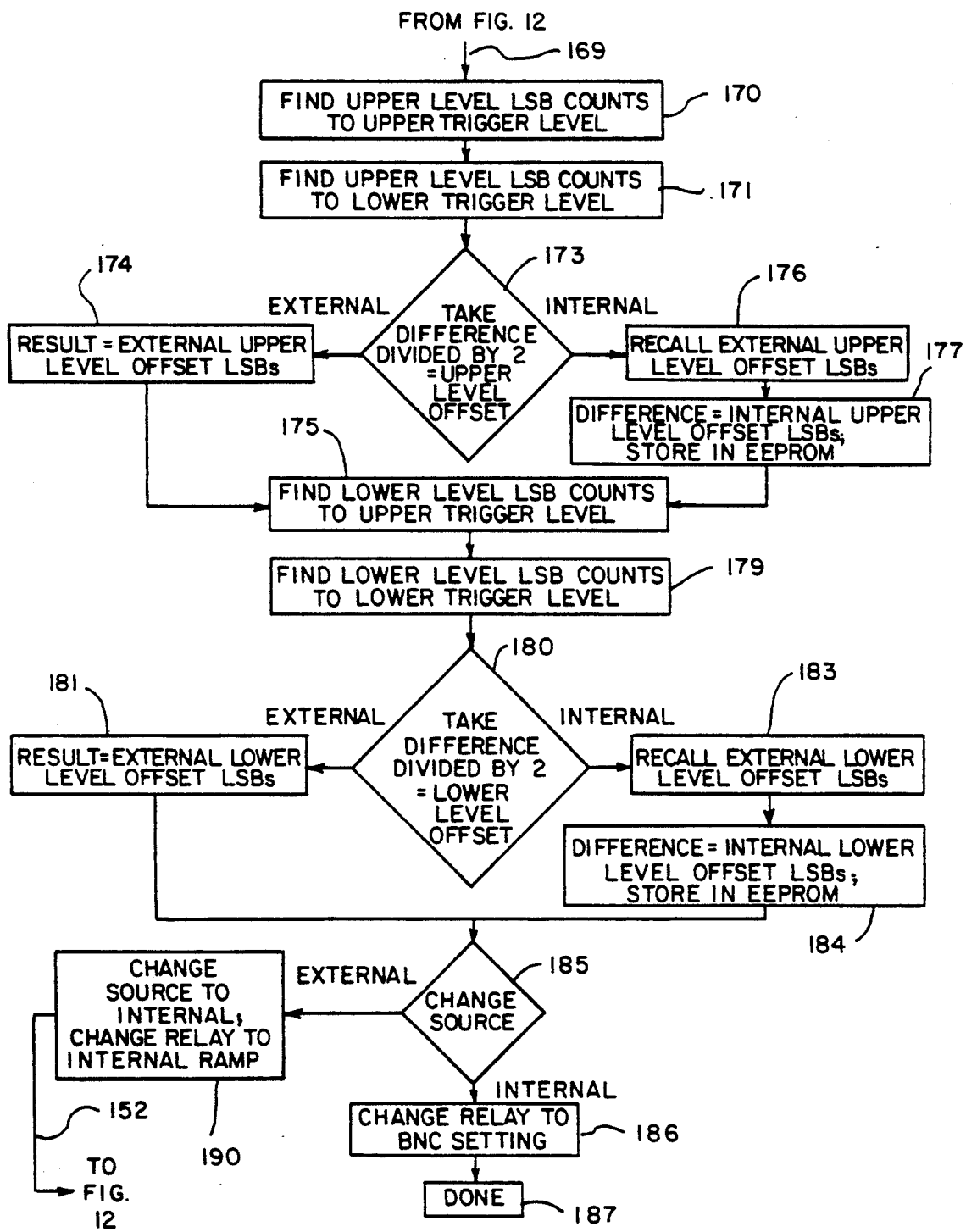

FIGS. 12-13 are flow charts showing the operation of the CPU 51 under its software control to carry out the initial external and internal calibration procedures described above. With reference to FIG. 12, the CPU is instructed to begin trigger calibration and initializes the source as external and sets the relay 140 to the BNC position (block 150). The program then determines whether the count boundary conditions are external or internal (151). The program may also be reentered at this point on the path 152 from the portion of the program shown in FIG. 13, as described further below.

At the decision point 151, if the boundary conditions are external, the program sets the upper bound to 100 and the lower bound to −100 (block 153) and then sets the count boundary equal to the upper bound minus the lower bound (block 154). If at 151 the boundary conditions are found as internal, the program finds the upper level least significant bits (LSB) counts to the upper trigger comparator level and sets this equal to the upper bound (block 155). The upper level LSB counts to the lower level trigger comparator are then found and set equal to the lower bound at 156 and the input scale factor is set equal to the upper bound minus the lower bound divided by 200 at 157, and this input scale factor is stored in the EEPROM The program then proceeds to 154 to set the count boundary equal to the upper bound minus the lower bound.

The reference DAC is then initialized to its maximum value at 160 and the number of upper LSBs between the top and bottom of the trigger range is found at 161. If this is less than the count boundary, the reference DAC is decremented by the current value divided by two at 162 and the program loops back to the block 161. If the number of upper level LSBs is greater than the count boundary, the program proceeds to increment the reference DAC by the current value divided by two at 163 and returns to the block 161. When the number of upper level LSBs is equal to the count boundary, the program proceeds to set the reference DAC value at 165. If the external source has been selected, the reference DAC external value is saved at 166. If the internal source is selected, the reference DAC internal value is saved (block 167) and the reference DAC scale factor is set equal to the reference DAC external value divided by the reference DAC internal value at 168, and this result is stored in the EEPROM. In either case, the program then proceeds along the path 169 as shown in FIG. 13.

The CPU operating in accordance with its program then finds the upper level LSB counts to the upper trigger level (block 170) and the upper level LSB counts to the lower trigger level (block 171). The program then finds the difference between the counts found in 170 and 171 and divides by two to determine the upper level offset. If an external calibration is being done, the result is then set equal to the external upper level offset LSBs at 174 and then the lower level LSB counts to the upper trigger level are found at block 175. If the calibration is internal, the external upper level offset LSBs are recalled at 176 and the difference is set equal to the internal upper level offset LSBs and the results stored in EEPROM (block 177) before proceeding to find the lower level LSB counts to the upper trigger level at block 175. Thereafter, the program finds the lower level LSB counts to the lower trigger level at 179, and takes the difference between the counts found at 175 and 179, divides by two, and sets this equal to the lower level offset at 181. If the calibration is external, the result is then set equal to the external lower level LSBs at 181, and, if internal, the external lower level LSB is recalled (block 183) and the difference is set equal to the internal lower level offset LSBs and the results stored in EEPROM at 184. Thereafter the program changes the source at 185; if internal, the relay is changed to the BNC setting at 186 and the program ends at 187. If external, the source is changed to internal, and the relay is changed to the internal ramp at block 190 and the program proceeds on the path 152 through the program steps of FIG. 12, starting with finding the count boundary conditions at block 151.

Figure 14:
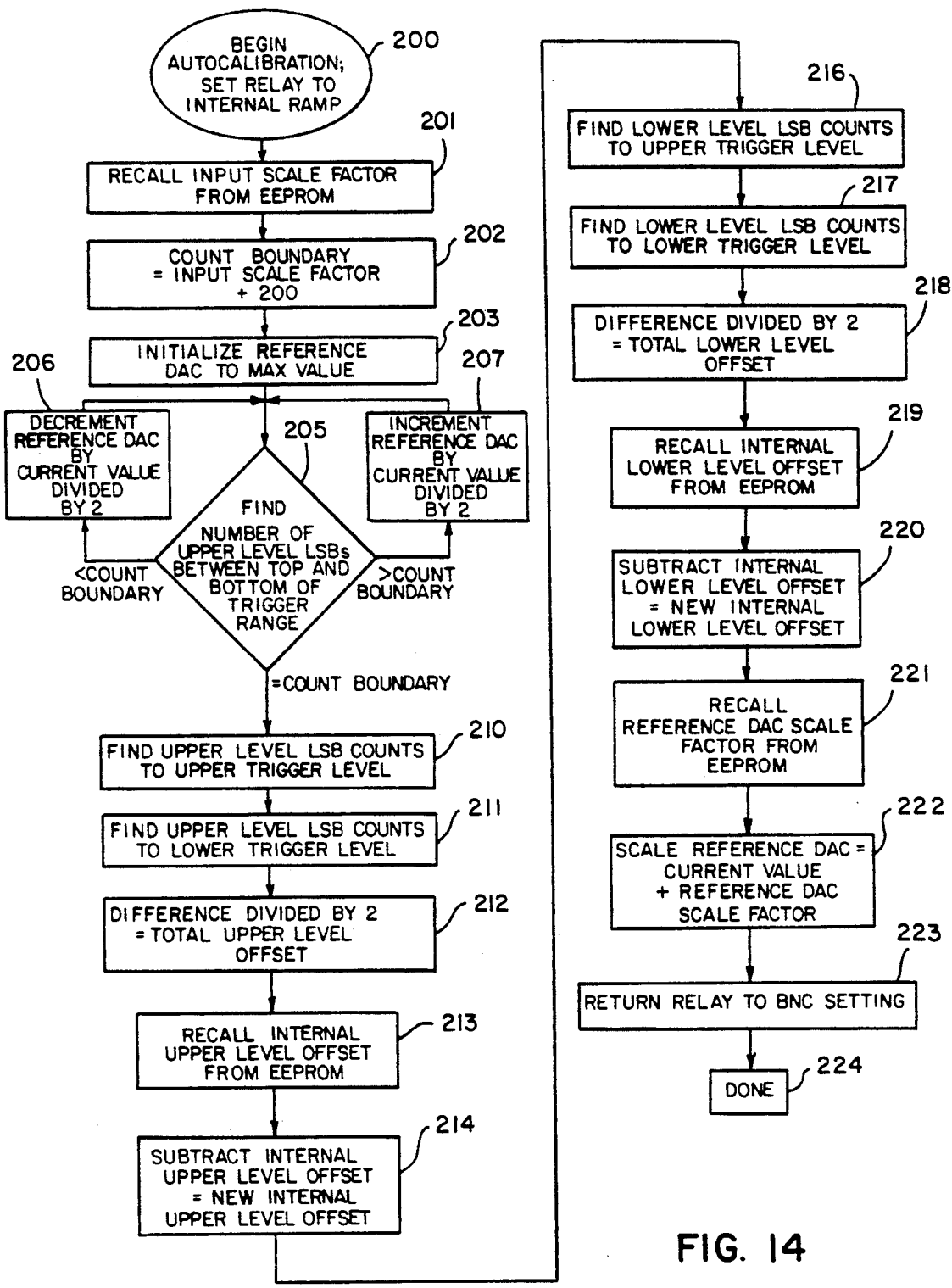

The autocalibration routine which is carried out by the apparatus under the control of the CPU running in accordance with its program is shown in the flow chart of FIG. 14. When autocalibration is selected, the relay is set to the internal ramp at 200, and the input scale factor is recalled from the EEPROM (block 101). The count boundary is then set equal to the input scale factor times two hundred at 202 and the reference DAC is initialized to its maximum value at 203. The number of upper level LSBs between the top and the bottom trigger range is then found at 205, and if this is less than the count boundary, the reference DAC is decremented by the current value divided by two at 206 before returning to the decision block 205. If the number of upper level LSBs at 205 is greater than the count boundary, the reference DAC is incremented by the current value divided by two at 207 before returning the decision block 205. If at 205 the number of upper level LSBs is equal to the count boundary, the upper level comparator LSB counts to the upper trigger level is found at 210 and the upper level comparator LSB counts to the lower level trigger is found at 211. The difference between these counts is then divided by two and set equal to the total upper level offset at 212. The internal upper level offset is then recalled from EEPROM at 213 and subtracted from the total upper level offset to find the new internal upper level offset at 214.

The lower level comparator LSB counts to the upper trigger level is found at 216, the lower level comparator LSB counts to the lower trigger level is found at 217, and the difference between the counts is divided by two and set equal to the total lower level offset at 218. The internal lower level comparator offset is recalled from the EEPROM at 219 and is subtracted from the total lower level offset to find the new internal lower level offset at 220.

The reference DAC scale factor is then recalled from the EEPROM at 221 and the scale for the reference DAC is set equal to the current value times the reference DAC scale factor at 222. The relay is then returned to the BNC setting at 223 and the program is completed (224) until the next event which initiates an autocalibration routine.

From the foregoing, it is seen that by utilizing the multiplying DAC configurations to achieve both gain and offset levels, dynamic calibration of the trigger circuitry is achieved. High triggering accuracy is obtained by placing emphasis on maintaining good DC performance in the level derivation circuitry, and by using an internal ramp source as the standard for internal calibrations. An internally run procedure under the control of the computer controller automatically searches for and calculates both calibration parameters (gain and offset) given current component characteristics and operating temperatures. This internal calibration can be performed in a relatively short period of time, for example, about 200 milliseconds, so that no delay in use of the oscilloscope is noted by the operator.

It is understood that the invention is not confined to the particular embodiments disclosed herein, but embraces such modified forms thereof as come within the scope of the following claims.

What is claimed is:

1. A method of calibrating a trigger signal channel of an oscilloscope which receives a trigger signal at an input and operates on it to provide a conditioned trigger signal having a gain and offset, the conditioned trigger signal being provided to one input of a comparator with the other input of the comparator being the reference voltage against which the conditioned trigger signal is compared, wherein the comparator changes its output state as the trigger signal to the comparator goes through the reference voltage level, comprising the steps of:
   (a) applying a calibration signal to the input of the trigger signal channel which varies linearly and periodically between known high and low voltage values which are equal to a nominal full scale trigger signal range, and which has zero offset;
   (b) applying a selected voltage level to the reference input of the comparator, determining whether the comparator changes state during the period of the trigger calibration signal and changing the voltage level provided to the reference input of the comparator until the voltage is at a level at which the comparator stops changing state at the maximum of the calibration signal during the period of the signal, and storing the voltage level value as the maximum voltage value;
   (c) providing another selected voltage level to the comparator reference input and then changing the voltage level until the comparator just stops changing states at the minimum of the calibration signal during the period of the signal, and storing the voltage value as the minimum voltage value;
   (d) comparing the difference between the maximum and minimum voltage values with the nominal full scale range of the trigger signal to determine a gain correction factor; and
   (e) thereafter correcting the value of the reference voltage being applied to the reference input of the comparator by the gain correction factor when triggering on input signals provided to the trigger signal channel input during normal oscilloscope operation.

2. The method of claim 1 including the further steps of:
   (1) applying a selected reference voltage corrected by the gain correction factor to the reference input of the comparator while the calibration signal is being applied to the trigger signal channel input and then changing the gain corrected reference voltage applied to the reference input of the comparator until the comparator stops changing state at a top voltage above a nominal level of zero volts and then changing the gain corrected voltage applied to the reference input of the comparator until the comparator stops changing at a bottom voltage below a nominal level of zero volts;
   (2) determining an offset correction factor as one-half the difference between the absolute values of the top and bottom voltages;
   (3) adding the offset correction factor to the reference voltage applied to the reference input of the comparator when triggering on a trigger signal applied to the input of the trigger signal channel.

3. The method of claim 2 wherein the oscilloscope includes an upper level comparator and a lower level comparator each receiving at one input the conditioned signal from the trigger signal channel and receiving two separate voltage levels at their reference inputs, and wherein steps (a) through (e) of claim 1 and steps (1) through (3) of claim 2 are carried out for each of the comparators to determine the gain correction factor and offset correction factor for each comparator.

4. The method of claim 1 wherein the oscilloscope has an upper level comparator and a lower level comparator each with a trigger signal input and a reference input, and wherein the steps (a) through (e) are carried out to determine a gain correction factor for the upper level comparator and the lower level comparator.

5. The method of claim 1 wherein the calibration signal is an external calibration signal and further including the steps of:
    (1) providing an internal calibration signal generator in the oscilloscope which provides an output signal which varies linearly and periodically between minimum and maximum voltage values;
    (2) applying the internal signal generator calibration signal to the input of the trigger signal channel;
    (3) applying a selected uncorrected voltage level to the reference input of the comparator and determining whether the comparator changes state during the period of the internal calibration signal and then changing the voltage applied to the reference input of the comparator until the voltage is at an upper level limit at which the comparator stops changing state at the maximum of the internal calibration signal, and then changing the voltage to the reference input until the voltage is at a lower level limit at which the comparator stops changing state at the minimum of the internal calibration signal;
    (4) comparing the difference between the upper and lower voltage level limits determined with the internal calibration signal with the difference between the maximum and minimum voltage levels determined with the external calibration signal to determine a ratio which is an initial calibration gain factor;
    (5) at a later time applying the internal calibration signal to the input of the trigger signal channel and carrying out steps (1) to (4) above to determine a new calibration gain factor and determining whether the new calibration gain factor differs from the initial calibration gain factor, and if it does, correcting the gain correction factor by the ratio of the initial calibration gain factor and the new calibration gain factor.

6. The method of claim 5 wherein the external calibration signal and the internal calibration signal are triangular wave signals which ramp linearly upperwardly to a maximum and then linearly downwardly to a minimum periodically.

7. The method of claim 5 including the further steps of:
    (1) applying a selected reference voltage corrected by the gain correction factor to the reference input of the comparator while the external calibration signal is being applied to the trigger signal channel input, and then changing the reference voltage, corrected by the gain correction factor, applied to the reference input of the comparator until the comparator stops changing state at a top voltage above a nominal level of zero volts and then changing the reference voltage, corrected by the gain correction factor, applied to the reference input of the comparator until the comparator stops changing at a bottom voltage below a nominal level of zero volts;
    (2) determining an offset correction factor as one-half the difference between the absolute values of the top and bottom voltages;
    (3) adding the offset correction factor to subsequent reference voltages applied to the reference input of the comparator when triggering on a trigger signal applied to the input of the trigger signal channel.

8. The method of claim 7 further including the steps of:
    (1) with the internal calibration signal applied to the trigger signal channel input, determining the top voltage applied to the reference input of the comparator above a nominal level of zero volts at which the comparator stops changing states and the bottom voltage below a nominal level of zero volts at which the comparator stops changing states,
    (2) determining an internal offset correction factor as one-half of the difference between the absolute values of the top and bottom voltages, and
    (3) comparing the internal offset correction factor determined for the internal calibration signal with the offset correction factor determined for the external calibration signal to provide an offset calibration ratio; and,
    (4) thereafter, at a later time applying the internal calibration signal to the input of the trigger signal channel and carrying out steps (1) through (3) above to provide a new offset calibration ratio and determining if the offset calibration ratio has changed, and, if so, providing a new offset calibration factor which is the offset calibration factor times the new offset calibration ratio.

9. The method of claim 1 wherein the calibration signal is a triangular wave signal which ramps linearly upwardly to a maximum and then linearly downwardly to a minimum periodically.

10. A method of calibrating a trigger signal channel of an oscilloscope which receives a trigger signal at an input and operates on it to provide a conditioned trigger signal having a gain and offset, the conditioned trigger signal being provided to one input of a comparator, with the other input of the comparator receiving a reference voltage against which the trigger signal is compared, wherein the comparator changes its output state as the trigger signal to the comparator goes through the reference voltage level, comprising the steps of:
    (a) providing the output voltage of a gain digital-to-analog converter which converts a digital input word to an analog output voltage to a level digital-to-analog converter which receives the analog voltage output of the gain digital-to-analog converter as its reference input, and providing the analog output of the level digital-to-analog converter to the reference input of the comparator, the analog output of the level digital-to-analog converter voltage determined by the digital input word provided to it and the reference voltage from the gain digital-to-analog converter;
    (b) applying a calibration signal to the input of the trigger signal channel which changes periodically and linearly between known high and low voltage values and which has zero offset to provide a conditioned calibration signal;
    (c) applying a digital input to the gain digital-to-analog converter to provide an upper limit output voltage from the gain digital-to-analog converter which is applied to the level digital-to-analog converter;

(d) applying a digital input to the level digital-to-analog converter which is at a value at which the output voltage of the level digital-to-analog converter will be in about the middle of its output range such that the output of the comparator is changing states;

(e) changing the value of the digital data provided to the level digital-to-analog converter until its output voltage is at a level at which the trigger comparator stops changing states at a voltage level which is at the maximum of the conditioned calibration signal and storing the digital input value at this maximum as a top digital data value;

(f) changing the digital data value provided to the level digital-to-analog converter until its output voltage is at a level at which the comparator stops changing states at the minimum of the conditioned calibration signal and storing the digital input value at this minimum as a bottom digital data value;

(g) subtracting the bottom digital data value from the top digital data value and comparing the difference with a full desired digital input range of the level digital-to-analog converter and determining whether the difference is equal to the full desired digital input range of the level digital-to-analog converter, and, if not, then (h) changing the value of the digital input to the gain digital-to-analog converter and repeating steps (b) through (g) above until the difference between the top and bottom input values is equal to the desired digital input range and then stopping and storing the value of the input to the gain digital-to-analog converter at that time as the gain correction count, and using that gain correction count as the input to the gain digital-to-analog converter for subsequent operation of the oscilloscope where the oscilloscope is triggering on a signal provided to the input of the trigger channel.

11. The method of claim 10 including the further steps of:

(1) applying the calibration signal to the input of the trigger signal channel and changing the digital data value provided to the level digital-to-analog converter until the comparator stops changing state at the top of the conditioned calibration signal waveform and storing the digital input value to the level digital-to-analog converter at this point as the upper value;

(2) changing the digital input data value to the level digital-to-analog converter until the trigger comparator stops changing state at the bottom of the conditioned trigger signal waveform and storing the digital input value to the level digital-to-analog converter at this point as the lower value;

(3) determining the upper digital count as the difference between the midpoint of the full desired digital input range to the level digital-to-analog converter and the upper value and the lower digital count as the difference between the midpoint and the lower value, and determining an offset correction factor as one-half of the upper digital count minus the absolute value of the lower digital count and storing this offset correction factor count;

(4) applying a trigger signal to the input of the trigger signal channel during normal operation of the oscilloscope, providing a digital data trigger level value which corresponds to a desired nominal voltage level at which triggering is to occur, and correcting that digital input data value by adding the offset correction factor count to the digital data trigger level value to yield a corrected digital level count, and then applying the corrected digital level count to the level digital-to-analog converter while applying the gain correction count to the gain digital-to-analog converter.

12. The method of claim 11 wherein the oscilloscope includes an upper level comparator and a lower level comparator each receiving at one input the conditioned signal from the trigger signal channel and receiving two separate voltage levels at their reference inputs, and wherein steps (b) through (h) of claim 10 and steps (1) through (3) of claim 11 are carried out for each of the comparators to determine the gain correction factor and offset correction factor for each comparator.

13. The method of claim 10 wherein the oscilloscope has an upper level comparator and a lower level comparator, each with a trigger signal input and reference input, wherein the analog output of the level digital-to-analog converter is provided to the upper level comparator reference input and further providing a second level digital-to-analog converter which provides its analog output to the reference input of the lower level comparator, and wherein the analog output of the gain digital-to-analog converter is provided to the reference input of both the first and second level digital-to-analog converters, and wherein the steps (a) through (h) of claim 10 are carried out to determine a gain correction count which is provided to the gain digital-to-analog converter for subsequent operation of the oscilloscope where the oscilloscope is triggering on a signal provided to the trigger channel which is provided to both the upper level comparator and the lower level comparator.

14. The method of claim 10 wherein the calibration signal is an external calibration signal and the method determines an external calibration gain correction count, and further including the steps of:

(1) providing an internal calibration signal generator in the oscilloscope which provides an output signal which varies linearly and periodically between minimum and maximum voltage values;

(2) applying the internal signal generator calibration signal to the input of the trigger signal channel;

(3) applying a selected uncorrected digital input to the gain digital-to-analog converter to provide an upper limit output voltage from the gain digital-to-analog converter which is applied to the level digital-to-analog converter;

(4) applying a digital input to the level digital-to-analog converter which is at a value at which the output voltage of the level digital-to-analog converter will be in about the middle of its output range such that the output of the comparator is changing states;

(5) changing the value of the digital data provided to the level digital-to-analog converter until its output voltage is at a level at which the trigger comparator stops changing states at a voltage level which is at the maximum of the conditioned internal calibration signal and storing the digital input value at this maximum as an internal top digital data value;

(6) changing the digital data value provided to the level digital-to-analog converter until its output voltage is at a level at which the comparator stops changing states at the minimum of the conditioned internal calibration signal and storing the digital input value at this minimum as an internal bottom digital data value;

(7) subtracting the internal bottom digital data value from the internal top digital data value and comparing the difference with the full desired digital input range of the level digital-to-analog converter and determining whether the difference is equal to the full desired internal digital input range of the level digital-to-analog converter, and, if not, then (8) changing the value of the digital input to the gain digital-to-analog converter and repeating steps (2) through (7) above until the difference between the internal top and bottom values is equal to the desired internal digital input range and then stopping and storing the value of the digital input to the gain digital-to-analog converter at that time as the internal calibration gain correction count, and determining the ratio of the external calibration gain correction count to the internal calibration gain correction count; and (9) at a later time applying the internal calibration signal to the input of the trigger signal channel and carrying out steps (2) through (7) above and determining whether any change has occurred in the ratio of the internal calibration gain correction count over the external calibration gain correction count and, if it has, correcting the external calibration gain correction count applied to the gain digital-to-analog converter by the change in the ratio.

15. The method of claim 14 including the further steps of:
(1) applying an external calibration signal to the input of the trigger signal channel and changing the digital data value provided to the level digital-to-analog converter until the comparator stops changing state at the top of the conditioned calibration signal and storing this digital input value to the level digital-to-analog converter at this point as the upper value;

(2) changing the digital input data value to the level digital-to-analog converter until the trigger comparator stops changing state at the bottom of the conditioned trigger signal and storing the digital input value to the level digital-to-analog converter at this point as the lower value;

(3) determining the upper digital count as the difference between the midpoint of the full desired digital input range to the level digital-to-analog converter and the upper value and the lower digital count as the difference between the midpoint and the lower value, and determining an offset correction factor as one-half of the upper digital count minus the absolute value of the lower digital count and storing this offset correction count;

(4) applying a trigger signal to the input of the trigger signal channel during normal operations of the oscilloscope, providing a digital data trigger level value which corresponds to a desired nominal voltage level at which triggering is to occur, and correcting that digital value by adding the offset correction count to the digital data trigger level value to yield a corrected digital level count, and then applying the corrected digital level count to the level digital-to-analog converter while applying the gain correction count to the gain digital-to-analog converter.

16. The method of claim 15 further including the steps of:
(1) with the internal calibration signal applied to the trigger signal channel input, determining an upper digital count as the difference between the nominal zero offset digital input value to the level digital-to-analog converter and the top digital input value at which the comparator stops changing states, and also determining a lower digital count as the difference between the nominal zero offset digital input value to the level digital-to-analog converter and the bottom digital input value at which the comparator stops changing states;

(2) determining an internal offset correction count as one-half of the upper digital count minus the absolute value of the lower digital count;

(3) comparing the internal offset correction count determined for the internal calibration signal with the offset correction count determined for the external calibration signal to provide an internal offset count; and (4) thereafter, at a later time applying the internal calibration signal to the input of the trigger signal channel and carrying out steps (1) through (3) above to determine if the internal offset count has changed, and, if so, providing a new offset correction count which is the internal offset correction count minus the internal offset count.

17. The method of claim 14 wherein the external calibration signal and the internal calibration signal are triangular wave signals which ramp linearly upperwardly to a maximum and then linearly downwardly to a minimum periodically.

18. The method of claim 10 wherein the calibration signal is a triangular wave signal which ramps linearly upwardly to a maximum and then linearly downwardly to a minimum periodically.

19. Trigger generating apparatus for an oscilloscope comprising:
(a) a trigger signal channel receiving a trigger signal at an input and operating on it to provide a conditioned trigger signal;

(b) a comparator which receives the conditioned trigger signal at one input with the other input of the comparator being the reference voltage against which the conditioned trigger signal is compared, wherein the comparator changes its output state as the trigger signal received by the comparator goes through the level of a reference voltage received by the comparator;

(c) means for providing a selectable output reference voltage to the reference input of the comparator based on digital input data values provided to it, including a gain digital-to-analog converter which converts a digital input data value to an analog output voltage and a level digital-to-analog converter which receives the analog voltage from the gain digital-to-analog converter as its reference voltage input and also receives a digital input data value and provides an analog output voltage which is determined by its digital input data value and the reference voltage, the output voltage of the level digital-to-analog converter determining the output voltage provided to the reference input of the comparator;

(d) control means for providing a digital input data value to the gain digital-to-analog converter and a digital input data value to the level digital-toanalog converter, the data value provided to the gain digital-to-analog converter determining the gain of the signal applied to the comparator and the data value provided to the level digital-to-analog converter determining the relative voltage level of the reference voltage provided to the comparator.

20. The apparatus of claim 19 wherein a calibration signal is provided to the input of the trigger signal channel which has a waveform which changes periodically and linearly between known high and low voltage values and which has zero offset and wherein the trigger signal channel provides a conditioned calibration signal, and wherein the control means applies a digital input value to the gain digital-to-analog converter to provide an upper limit output voltage from the gain digital-to-analog converter which is applied to the level digital-to-analog converter, and then applies a digital input value to the level digital-to-analog converter which is at a value at which the output voltage of the level digital-to-analog converter will be in about the middle of its output range such that the output of the comparator is changing states, and then changes the value of the digital data provided to the level digital-to-analog converter until its output voltage is at a level at which the trigger comparator stops changing states at a voltage level which is at the maximum of the waveform of the conditioned calibration signal and stores the digital input value at this maximum as the top value, and wherein the control means changes the digital data value it provides to the level digital-to-analog converter until its output voltage is at a level at which the comparator stops changing states at the minimum of the waveform of the conditioned calibration signal and stores the digital input value at this minimum as the bottom value, and the subtracts the bottom value from the top value and compares the difference with a predetermined full desired digital input range of the level digital-to-analog converter and determines whether the difference is equal to the full desired digital input range of the level digital-to-analog converter, and, if not, then changes the value of the digital input value to the gain digital-to-analog converter and repeats these steps above until the difference between the top and bottom values is equal to the desired digital input range and then stores the value of the digital input value to the gain digital-to-analog converter at that time as a calibration correction count, and wherein that gain correction count is thereafter provided by the control means as the input to the gain digital-to-analog converter for subsequent operation of the trigger generating apparatus of the oscilloscope where it is triggering on a signal provided to the input of the trigger channel.

21. The apparatus of claim 20 including means for applying a calibration signal to the input of the trigger signal channel and wherein the control means changes the digital data value provided to the level digital-to-analog converter until the comparator stops changing state at the top of the conditioned calibration signal waveform and stores this digital input value to the level digital-to-analog converter at this point as the top value, and changes the digital input value to the level digital-to-analog converter until the trigger comparator stops changing state at the bottom of the conditioned trigger signal waveform and stores the digital input value to the level digital-to-analog converter at this point as the bottom value, and determines the upper digital count as the difference between the midpoint of the full desired digital input range to the level digital-to-analog converter and the top value and the lower digital count as the difference between that midpoint and the bottom value, and determines an offset correction factor as one-half of the upper digital count minus the absolute value of the lower digital count and stores this offset correction factor count, and wherein during normal operation of the oscilloscope where a trigger signal is applied to the trigger signal channel, the control means corrects a digital data value which corresponds to a nominal voltage level at which triggering is to occur by adding the offset correction factor count to the digital data value to yield a corrected digital level count and then applies the corrected digital level count to the level digital-to-analog converter and applies the gain correction count to the gain digital-to-analog converter.

22. The apparatus of claim 20 wherein the calibration signal is an external and the method determines an external calibration gain correction count, and further including:
(1) internal calibration signal generator means for providing an output signal which varies linearly and periodically between minimum and maximum voltage values, the signal from the internal signal generator means being applied to the input of the trigger signal channel;
(2) wherein the control means further applies a selected uncorrected digital input to the gain digital-to-analog converter while the internal calibration signal is applied to the trigger signal channel to provide an upper limit output voltage from the gain digital-to-analog converter which is applied to the level digital-to-analog converter, and applies a digital input to the level digital-to-analog converter which is at a value at which the output voltage of the level digital-to-analog converter will be in about the middle of its output range such that the output of the comparator is changing states, and changes the value of the digital data provided to the level digital-to-analog converter until its output voltage is at a level at which the trigger comparator stops changing states at a voltage level which is at the maximum of the conditioned calibration signal waveform and stores the digital input value at this maximum as the top value, and changes the digital data value provided to the level digital-to-analog converter until its output voltage is at a level at which the comparator stops changing states at the minimum of the conditioned internal calibration waveform and stores the digital input value at this minimum as the bottom value, and subtracts the bottom digital data value from the top digital data value and compares the difference with a full desired internal digital input range of the level digital-to-analog converter and determines whether the difference is equal to the full desired internal digital input range of the level digital-to-analog converter, and, if not, then decreases the value of the digital input to the gain digital-to-analog converter and repeats the steps above until the difference between the top and bottom input values is equal to the desired digital input range and then stops and stores the value of the digital input to the gain digital-to-analog converter at that time as the internal calibration gain correction count, and determines the ratio of the calibration gain correction count to the internal calibration gain correction count, and, at a later time, controls the internal calibration signal generator means to provide the internal calibration signal to the input of the trigger signal channel and carries out the steps above to determine whether any changes occurred in the ratio of the external calibration gain correction count over the internal calibration gain correction count and, if it has, then corrects the gain correction count provided to the gain digital-to-analog converter by the change in the ratio.

23. The apparatus of claim 22 wherein the internal calibration signal generator means provides a calibration signal which is a triangular wave signal which ramps linearly upwardly to a maximum and then linearly downwardly to a minimum periodically.

24. The apparatus of claim 22 wherein the internal calibration signal generator means includes a ramp digital-to-analog converter which receives digital input data and provides an output analog voltage which may be selectively connected to the input to the trigger signal channel.

25. The apparatus of claim 24 wherein the control means provides digital data to the ramp digital-to-analog converter to cause the converter to provide a triangular wave signal which ramps linearly upwardly to a maximum and then linearly downwardly to a minimum periodically.

26. The apparatus of claim 19 including an additional comparator, one of the two comparators being an upper level comparator and the other being a lower level comparator, each with a trigger signal input and a reference input, and wherein the analog output of the level digital-to-analog converter is provided to the upper level comparator reference input and further including a second level digital-to-analog converter which provides its analog output to the reference input of the lower level comparator, and wherein the analog output of the gain digital-to-analog converter is provided to the reference input of both the first and second level digital-to-analog converters.

27. The apparatus of claim 26 wherein the control means determines a gain correction count, based on a calibration signal provided to the apparatus, which is provided to the gain digital-to-analog converter for subsequent operation of the oscilloscope trigger apparatus when triggering on a signal provided to the triggering channel wherein the conditioned trigger signal is provided to both the upper level comparator and the lower level comparator.

28. A method of calibrating a trigger signal channel of an oscilloscope which receives a trigger signal at an input and operates on it to provide a conditioned trigger signal having a gain and offset, the conditioned trigger signal being provided to one input of a comparator with the other input of the comparator being the reference voltage against which the conditioned trigger signal is compared, wherein the comparator changes its output state as the trigger signal to the comparator goes through the reference voltage level, comprising the steps of:
 (a) applying a calibration signal to the input of the trigger signal channel which varies linearly and periodically between known high and low voltage values which are equal to a nominal full scale trigger signal range, and which has zero offset;
 (b) applying a selected trigger level voltage to the reference input of the comparator while the calibration signal is being applied to the trigger signal channel input and then changing the trigger level voltage applied to the reference input of the comparator until the comparator stops changing state at a top voltage above a nominal level of zero volts and then changing the voltage applied to the reference input of the comparator until the comparator stops changing at a bottom voltage below a nominal level of zero volts;
 (c) determining an offset correction factor as one-half the difference between the absolute values of the top and bottom voltages;
 (d) adding the offset correction factor to nominal trigger level voltages applied to the reference input of the comparator when triggering on a trigger signal applied to the input of the trigger signal channel.

29. The method of claim 28 wherein the oscilloscope has an upper level comparator and a lower level comparator each with a trigger signal input and a reference input, and wherein the steps (a) through (d) of claim 28 are carried out to determine an offset correction factor for the upper level comparator and for the lower level comparator.

30. The method of claim 28 wherein the calibration signal is an external calibration signal and further including the steps of:
 (1) providing an internal calibration signal generator in the oscilloscope which provides an output signal which varies linearly and periodically between minimum and maximum voltage values;
 (2) applying the internal signal generator calibration signal to the input of the trigger signal channel;
 (3) with the internal calibration signal applied to the trigger signal channel input, determining the internal top voltage applied to the reference input of the comparator above a nominal level of zero volts at which the comparator stops changing states and the internal bottom voltage below a nominal level of zero volts at which the comparator stops changing states,
 (4) determining an internal offset correction count as one-half of the difference between the absolute values of the internal top and bottom voltages, and
 (5) comparing the internal offset correction count with the offset correction count determined for the external calibration signal to provide an internal offset count; and,
 (6) thereafter, at a later time applying the internal calibration signal to the input of the trigger signal channel and carrying out steps (2) through (5) above to determine if the internal offset correction count has changed, and, if so, providing a new offset correction count which is the internal offset correction count minus the internal offset count.

31. The method of claim 28 wherein the calibration signal is a triangular wave signal which ramps linearly upwardly to a maximum and then linearly downwardly to a minimum periodically.

32. The method of claim 30 wherein the external calibration signal and the internal calibration signal are triangular wave signals which ramp linearly upperwardly to a maximum and then linearly downwardly to a minimum periodically.

33. A method of calibrating a trigger signal channel of an oscilloscope which receives a trigger signal at an input and operates on it to provide a conditioned trigger signal having a gain and offset, the conditioned trigger signal being provided to one input of a comparator, with the other input of the comparator receiving a reference voltage against which the trigger signal is compared, wherein the comparator changes its output state as the trigger signal to the comparator goes through the reference voltage level, comprising the steps of:

(a) providing the output voltage of a gain digital-to-analog converter, which converts a digital input value to an analog output voltage, to a level digital-to-analog converter which receives the analog voltage output of the gain digital-to-analog converter as its reference input, and providing the analog output of the level digital-to-analog converter to the reference input of the comparator, the analog output of the level digital-to-analog converter voltage determined by the digital input value provided to it and the reference voltage from the gain digital-to-analog converter;

(b) applying a calibration signal to the input of the trigger signal channel which changes periodically and linearly between known high and low voltage values and which has zero offset;

(c) changing the digital input value provided to the level digital-to-analog converter until the comparator stops changing state at the top of the conditioned calibration signal waveform and storing this digital input value to the level digital-to-analog converter at this point as the top value;

(d) changing the digital input data value to the level digital-to-analog converter until the trigger comparator stops changing state at the bottom of the conditioned trigger signal and storing the digital input value to the level digital-to-analog converter at this point as the bottom value;

(e) determining the upper digital count as the difference between the midpoint of a full desired digital input range to the level digital-to-analog converter and the top value and the lower digital count as the difference between the midpoint and the bottom value, and determining an offset correction factor as one-half of the upper digital count minus the absolute value of the lower digital count and storing this offset correction factor count;

(f) applying a trigger signal to the input of the trigger signal channel during normal operation of the oscilloscope, providing a digital data value which corresponds to a desired nominal voltage level at which triggering is to occur, and correcting that digital input data value by adding the offset correction factor count to it to yield a corrected digital level count and then applying the corrected digital level count to the level digital-to-analog converter.

34. The method of claim 33 wherein the oscilloscope has an upper level comparator and a lower level comparator, each with a trigger signal input and reference input, wherein the analog output of the level digital-to-analog converter is provided to the upper level comparator reference input and further providing a second level digital-to-analog converter which provides its analog output to the reference input of the lower level comparator, and wherein the analog output of the gain digital-to-analog converter is provided to the reference input of both the first and second level digital-to-analog converters.

35. The method of claim 33 wherein the calibration signal is an external calibration signal and further including the steps of:

(1) providing an internal calibration signal generator in the oscilloscope which provides an output signal which varies linearly and periodically between minimum and maximum voltage values;

(2) applying the internal signal generator calibration signal to the input of the trigger signal channel; (3) with the internal calibration signal applied to the trigger signal channel input, determining an upper digital count as the difference between the nominal zero offset digital input value to the level digital-to-analog converter and the top digital input value at which the comparator stops changing states, and also determining a lower digital count as the difference between the nominal zero offset digital input value to the level digital-to-analog converter and the bottom digital input value at which the comparator stops changing states;

(4) determining an internal offset correction count as one-half of the upper digital count minus the absolute value of the lower digital count;

(5) comparing the internal offset correction count determined for the internal calibration signal with the offset correction count determined for the external calibration signal to provide an internal offset count; and (6) thereafter, at a later time applying the internal calibration signal to the input of the trigger signal channel and carrying out steps (2) through (5) above to determine if the internal offset count has changed, and, if so, providing a new offset correction count which is the internal offset correction count minus the internal offset count.

36. The method of claim 35 wherein the external calibration signal and the internal calibration signal are triangular wave signals which ramp linearly upwardly to a maximum and then linearly downwardly to a minimum periodically.

37. The method of claim 33 wherein the calibration signal is a triangular wave signal which ramps linearly upwardly to a maximum and then linearly downwardly to a minimum periodically.

38. The method of claim 33 wherein the oscilloscope includes an upper level comparator and a lower level comparator each receiving at one input the conditioned signal from the trigger signal channel and receiving two separate voltage levels at their reference inputs.

* * * * *